United States Patent [19]

Tamagawa et al.

[11] Patent Number: 5,777,838
[45] Date of Patent: Jul. 7, 1998

[54] ELECTROSTATIC CHUCK AND METHOD OF ATTRACTING WAFER

[75] Inventors: Koki Tamagawa; Kojiro Takahashi; Takahiko Suzuki; Ryuichi Fukunishi, all of Aizuwakamatsu, Japan

[73] Assignee: Fujitsu Limited, Kawasaki, Japan

[21] Appl. No.: 752,932

[22] Filed: Nov. 20, 1996

[30] Foreign Application Priority Data

Dec. 19, 1995 [JP] Japan ................ 7-330663

[51] Int. Cl.$^6$ ................................. H02N 13/00
[52] U.S. Cl. ............................. 361/234; 279/128
[58] Field of Search .............................. 361/234, 233, 361/230; 279/128; 269/8; 29/825, 829

[56] References Cited

U.S. PATENT DOCUMENTS

| | | | |
|---|---|---|---|
| 4,384,918 | 5/1983 | Abe . | |
| 4,551,192 | 11/1985 | Di Milia et al. | 156/345 |
| 4,665,463 | 5/1987 | Ward et al. | 361/234 |
| 5,001,594 | 3/1991 | Bobbio | 361/234 |
| 5,160,152 | 11/1992 | Toraguchi et al. | 361/234 |
| 5,522,131 | 6/1996 | Steger | 361/234 |
| 5,530,616 | 6/1996 | Kitabayashi et al. | 361/234 |
| 5,531,835 | 7/1996 | Fodor et al. | 118/728 |
| 5,535,090 | 7/1996 | Sherman | 361/234 |
| 5,566,043 | 10/1996 | Kawada et al. | 361/234 |
| 5,583,736 | 12/1996 | Anderson et al. | 361/234 |
| 5,591,269 | 1/1997 | Arami et al. | 118/723 R |
| 5,600,530 | 2/1997 | Smith | 361/234 |
| 5,607,541 | 3/1997 | Kubota et al. | 361/234 |
| 5,625,526 | 4/1997 | Watanabe et al. | 361/234 |

FOREIGN PATENT DOCUMENTS 7-18438  1/1995  Japan .

*Primary Examiner*—Fritz Fleming
*Attorney, Agent, or Firm*—Nikaido, Marmelstein, Murray & Oram LLP

[57] ABSTRACT

An electrostatic chuck including an electrode having first and second surfaces, a dielectric member having a first layer for covering at least the first surface of the electrode, a power supply for conducting electric power to the electrode, and a cooling gas-feeding means for feeding a cooling gas onto the surface of the first layer of the dielectric member. A plurality of fine projections 28 are formed on the surface of the first layer of the dielectric member. Each of the fine projections 28 has a tip smaller than a root thereof so as to hold a wafer W in substantially a point-contact manner. The wafer can be held on the surface of the first layer of the dielectric member and cooled by the cooling gas fed from the cooling gas-feeding means.

15 Claims, 10 Drawing Sheets

$$Ra = \frac{1}{\ell} \int_0^1 |f(x)| dx$$

ELECTROSTATIC CHUCK AND METHOD OF ATTRACTING WAFER

BACKGROUND OF THE INVENTION

1. Field of the Invention

The present invention relates to an electrostatic chuck used in processes, such as CVD and etching, for producing semiconductors, and a method of attracting a wafer.

2. Description of the Related Art

In a process, such as CVD or etching, for producing semiconductors, a wafer is held by an electrostatic chuck in a vacuum chamber and is subjected to various treatments. The electrostatic chuck is formed by embedding an electrode in the dielectric member, and the wafer is placed on the surface of the dielectric member and held on the surface of the dielectric member by a coulomb force acting between the wafer and the electrode. The electrostatic chuck of this kind has been disclosed in, for example, U.S. Pat. No. 4,384,918 and Japanese Unexamined Patent Publication (Kokai) No. 7-18438.

Grooves of a circular shape or any other shape are formed in the surface of the dielectric member where the wafer is to be held. A cooling gas such as Helium gas is introduced into the grooves. The cooling gas cools the wafer so that the wafer is maintained at a suitable temperature. A portion of the surface of the dielectric member around the grooves comes into a point-contact with the surface of the wafer and, hence, heat is conducted from the wafer to the dielectric member or from the dielectric member to the wafer.

In the dielectric member, the temperature often varies depending on the position, for example, at the central portion and the peripheral portion. Even when a cooling gas is permitted to flow, the temperature of the wafer is not uniform, so an etching rate and a film-forming rate become nonuniform in the wafer, and the wafer is often warped, causing the yield to decrease.

When the wafer contacts the dielectric member over a wide area, furthermore, a temperature distribution occurs in the wafer and, besides, the temperature of the wafer may be changed for every lot. Therefore, the operator must frequently adjust the voltage and the pressure of the cooling gas, resulting in a decreased operation efficiency.

In addition, the wafer is held by the electrostatic chuck due to a coulomb force, but when the cooling is effected using a cooling gas, the pressure of the cooling gas acts in a direction to push the wafer off the electrostatic chuck. Accordingly, the attracting force of the electrostatic chuck must be strong enouth to hold the wafer against the pressure of the cooling gas. The coulomb force varies in proportion to $(V/d)^2$. To increase the coulomb force, therefore, it becomes necessary to decrease the thickness of the dielectric layer between the wafer and the electrode. In a conventional electrostatic chuck, for example, the dielectric layer between the wafer and the electrode had to have a thickness of from 0.2 to 0.4 mm. As the thickness of the dielectric layer decreases in this way, however, a problem arises in regard to the withstand voltage of the dielectric layer against a voltage applied across the wafer and the electrode.

In a highly dense plasma environment, the electrostatic chuck is heated together with the wafer. In the CVD device, furthermore, the electrostatic chuck itself is often heated to about 500° C. The ceramic which is the material of the dielectric member exhibits resistivity which decreases with an increase in the temperature. When the electrostatic chuck is heated to a very high temperature, therefore, the resistance decreases, a leakage current increases, and the wafer can be damaged.

In the layer of the dielectric member on the opposite side of the wafer-holding surface thereof, furthermore, a hole is drilled toward the electrode from the outside, and a metal terminal material such as KOVAR™ material for wiring terminals is provided in the hole. A gap is formed between the metal terminal and the wall of the hole, and if the gap is left unfilled, the heat conductivity of the dielectric member is deteriorated. Therefore, the gap is filled with a silicone grease. However, it is difficult to fill the gap with the silicone grease when it has a high viscosity. On the other hand, a silicone grease having a low viscosity flows out during use.

SUMMARY OF THE INVENTION

The object of the present invention is to provide an electrostatic chuck which is capable of reliably holding the wafer at a stable temperature.

Another object of the present invention is to provide an electrostatic chuck which is capable of holding the wafer to a sufficient degree against the pressure of the cooling gas and has a sufficiently large withstand voltage characteristics.

A further object of the present invention is to provide an electrostatic chuck which can be used even at high temperatures without causing the heat conductivity to be deteriorated at the terminal of the electrode.

The electrostatic chuck according to the present invention comprises an electrode having first and second surfaces, a dielectric member having a first layer for covering at least the first surface of said electrode, power supply means for conducting electric power to said electrode, and cooling gas-feeding means for feeding a cooling gas onto the surface of said first layer of said dielectric member, wherein a plurality of fine projections are formed on the surface of said first layer of said dielectric member, said fine projections being shaped to have a tip and a root, the tip being smaller than the root to hold a wafer in substantially a point-contact manner, and the wafer held on the surface of the first layer of said dielectric member is cooled by the cooling gas fed from said cooling gas-feeding means.

In this arrangement, the wafer and the dielectric member come into a substantial point-contact with each other, enabling the heat conduction between the wafer and the dielectric member to become negligibly small. The cooling gas comes into a substantial contact with the wafer except for the surface of the wafer on the side being treated. Therefore, the wafer is uniformly cooled by the cooling gas, and the temperature distribution becomes uniform in the wafer. Even when the temperature distribution exists in the dielectric member, the wafer is almost not in contact with the dielectric member and is less affected by the temperature distribution in the dielectric member. When a voltage is applied across the electrode and the wafer, the electric charge is concentrated at fine projections, whereby a strong attracting force is produced and the wafer is reliably attracted to the dielectric member. Therefore, even when the pressure of the cooling gas is elevated, the wafer is reliably attracted to the dielectric member.

As a preferable example of the fine projections having the tip smaller than the root, the fine projections are formed in the shape of a dome or a pyramid.

In order that the wafer is more reliably and uniformly cooled by the cooling gas, it is desired that the fine projections are arranged in a predetermined configuration at a predetermined pitch. In this case, it is desired that the fine projections are arranged at a pitch of not larger than 4 mm.

Preferably, the fine projections have a height smaller than a mean free path of the cooling gas. In this case, molecules of the cooling gas do not come into collision within the height of the fine projections, i.e., within the gap between the wafer and the surface of the dielectric member. Accordingly, no heat is generated by the collision, and the cooling is efficiently accomplished by the cooling gas.

In this case, the height of the fine projections is preferably smaller than 30 μm. When, for example, helium is used as the cooling gas, the mean free path of helium is 147.2 μm at a temperature of 25° C. under a pressure of 1 Torr. When the wafers are to be cooled using the electrostatic chuck, helium is, in many cases, used maintaining a pressure of from 5 to 20 Torr and, in this case, the mean free path is from 15 to 30 μm. It is, therefore, desired that the fine projections have a height of from 15 to 30 μm.

To enhance the heat-exchanging efficiency between the cooling gas and the electrostatic chuck, the coarseness Ra of the surface of the dielectric member including the fine projections should be set to lie over a range of from 1 to 2 μm. This enables the accommodation coefficient of the cooling gas to be not smaller than 0.1.

When a high voltage is to be applied between the wafer and the electrode, the first layer of the dielectric member must have such a thickness as to exhibit high withstand voltage characteristics. When a high voltage is applied, the thickness of the first layer of the dielectric member calculated from the required coulomb force is as relatively small as from 0.2 to 0.3 mm, which may not often be satisfactory for obtaining required withstand voltage characteristics. When the dielectric member is of a low resistance type and when the layer of the dielectric member on one surface of the electrode has a thickness of not smaller than 0.5 mm, then, satisfactory withstand voltage characteristics are obtained against the applied voltage.

In order to solve the problem that the resistivity of the dielectric member decreases with an increase in the temperature and a leakage current larger than an allowable current flows into the wafer as the electrostatic chuck is heated at a considerably high temperature, furthermore, it is desired to use a ceramic containing not less than 30% of silicon dioxide ($SiO_2$) as the dielectric member.

In order to reliably fill the gap between the metal terminal provided in the hole in the dielectric member and the wall of the hole, furthermore, it is desired that the dielectric member has a second layer for covering the second surface of the electrode, and the means for conducting the electric power to the electrode comprises a metal terminal which is disposed in the hole formed in the second layer of the dielectric member and is connected to the electrode, and a soft metal which is melt-inserted between the metal terminal and the wall of the hole formed in the second layer and hardened.

Similarly, it is desired that the dielectric member has a second layer for covering the second surface of the electrode, and the means for conducting the electric power to the electrode comprises a metal terminal which is disposed in the hole formed in the second layer of the dielectric member and is connected to the electrode, and a highly heat-conducting resin inserted between the metal terminal and the wall of the hole formed in the second layer.

A method of attracting a water in an electrostatic chuck, according to the present invention, comprises the steps of placing a wafer in a substantially point-contacting manner on fine projections provided on the surface of a dielectric member which covers the surface of an electrode applying voltage to said electrode so that the wafer is attracted to the surface of said dielectric member, and introducing a cooling gas between said dielectric member and said water.

BRIEF DESCRIPTION OF THE DRAWINGS

The present invention will become more apparent from the following description of the preferred embodiments, with reference to the accompanying drawings, in which.

DETAILED DESCRIPTION OF THE PREFERRED EMBODIMENTS

Embodiments of the invention will now be described.

Figure 1:
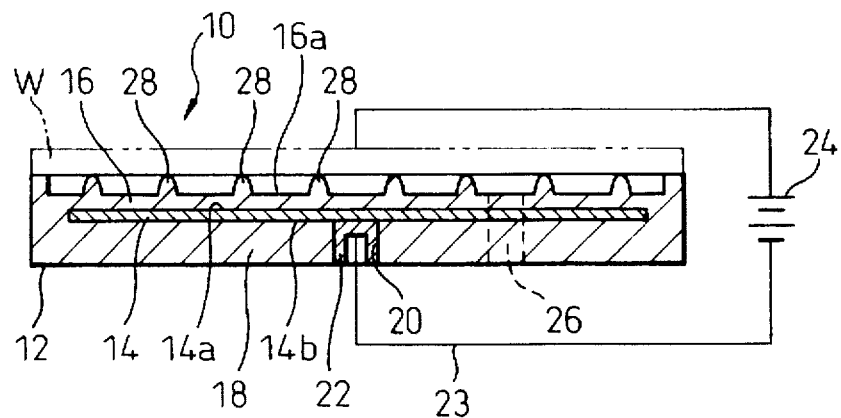
FIG. 1 is a cross-sectional view of an electrostatic chuck according to an embodiment of the present invention.
Figure 2:
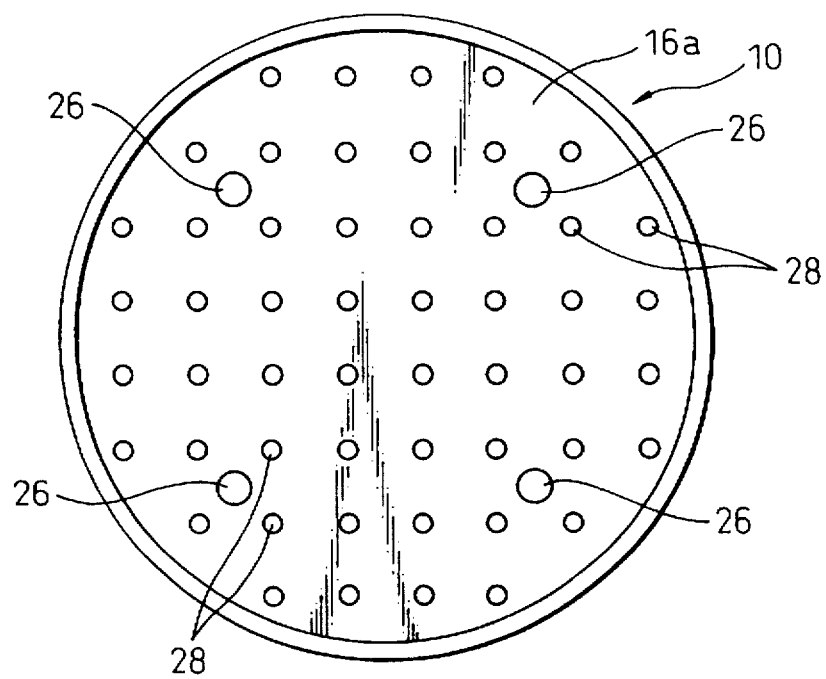
FIG. 2 is a plan view of the electrostatic chuck of FIG. 1.

Referring to FIGS. 1 and 2, an electrostatic chuck 10 comprises a disk-like dielectric member 12 and a flat disk-like electrode 14 embedded in the dielectric member 12. The electrode 14 has first and second surfaces 14a and 14b. The dielectric member 12 has a first layer 16 for covering the first surface 14a of the electrode 14 and a second layer 18 for covering the second surface 14b of the electrode 14.

A hole 20 is formed in the second layer 18 of the dielectric member 12, and a metal terminal 22 is disposed in the hole 20. The metal terminal 22 is electrically connected to the electrode 14 and is further connected to a power source 24 through a lead wire 23. A wafer W represented by an imaginary line in FIG. 1 is also connected to the power source 24, and a voltage is applied across the electrode 14 and the wafer W with the first layer 16 of the dielectric member 12 sandwiched therebetween. When the wafer W is to be treated in a plasma atmosphere, the plasma is negatively charged and the wafer W is in contact with the plasma, obviating the need to connect the wafer W to the power source through the lead wire.

Figure 7:
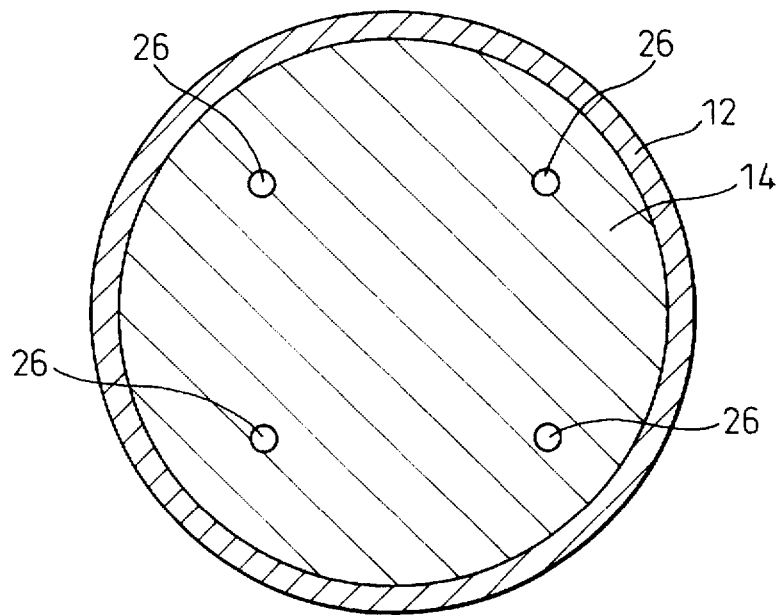
FIG. 7 is a cross-sectional view in the plane passing through the electrode of the electrostatic chuck of FIG. 1.

FIG. 7 illustrates an example of the electrode 14 in the shape of a disk which is slightly smaller than the circular dielectric member 12. In this case, the electrode 14 is connected to one side of the power source 24 as shown in FIG. 1.

Figure 8:
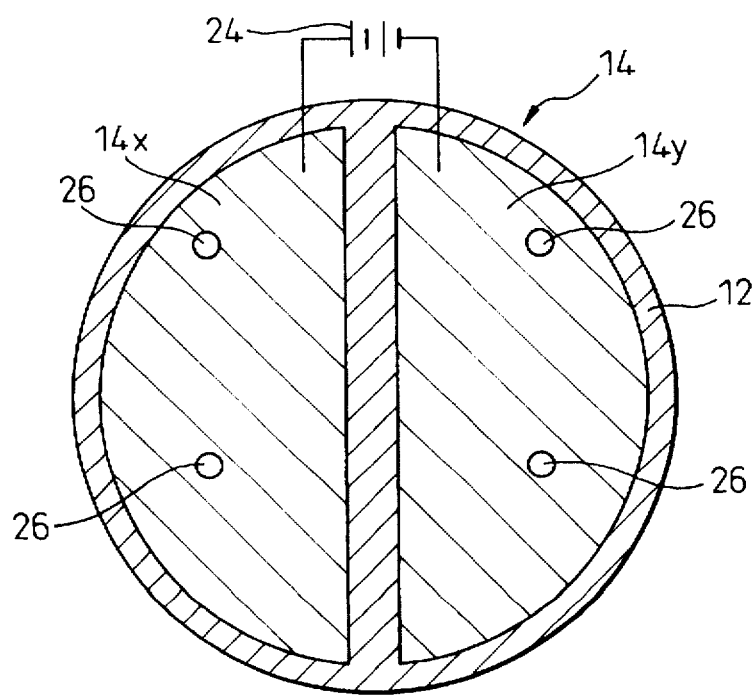
FIG. 8 is a cross-sectional view of the electrostatic chuck having another example of the electrode.

FIG. 8 illustrates another example of the electrode 14 which is divided into two semicircular plates 14x and 14y. In this case, the two semicircular plates 14x and 14y are connected to both sides of the power source 24. The electrode 14 of the split type does not need be limited to semicircular plates but may assume any other shapes such as comb-toothed shapes or radial shapes.

In FIGS. 1 and 2, cooling gas-feeding ports 26 are formed through the dielectric member 12 and the electrode 14. The cooling gas such as helium gas is fed onto the surface 16a of the first layer 16 of the dielectric member 12 from a gas source (not shown) to cool the wafer W held on the surface 16a of the first layer 16 of the dielectric member 12.

Moreover, a plurality of fine projections 28 are formed on the surface 16a of the first layer 16 of the dielectric member 12. The fine projections 28 have a tip smaller than a root so as to hold the wafer W in a substantially point-contact manner.

Figure 3:
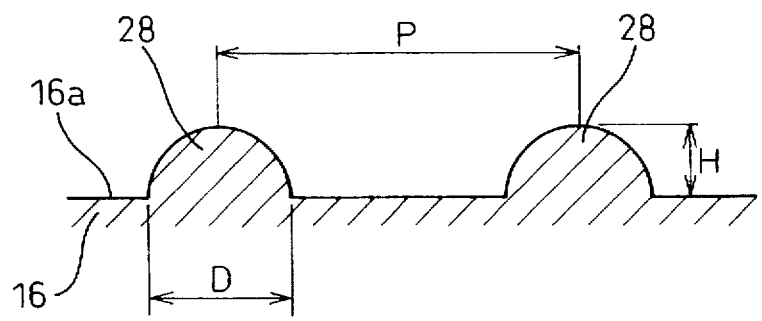
FIG. 3 is a cross-sectional view of the fine projections of FIGS. 1 and 2 on an enlarged scale.

In an example of FIG. 3, the fine projections 28 are formed in the shape of a dome.

Figure 4:
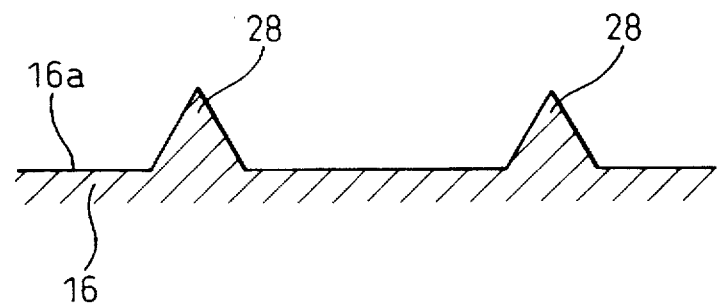
FIG. 4 is a cross-sectional view of another example of the fine projections.

In an example of FIG. 4, the fine projections 28 are formed in the shape of a square pyramid. The fine projections 28 of the dome shape will be described in further detail, but the description can be also adapted to the fine projections 28 of any other shape such as square pyramid and the like.

Referring to FIGS. 1 to 3, the fine projections 28 have an identical configuration and are arranged at a constant pitch. Referring to FIG. 3, the fine projections 28 have the shape of a circular dome, the diameter D of the root portion thereof being 0.8 mm and the height H thereof being 0.02 mm. The pitch P between the neighboring two fine projections 28 is desirably not larger than 4 mm and is 3 mm in this embodiment.

Figure 5:
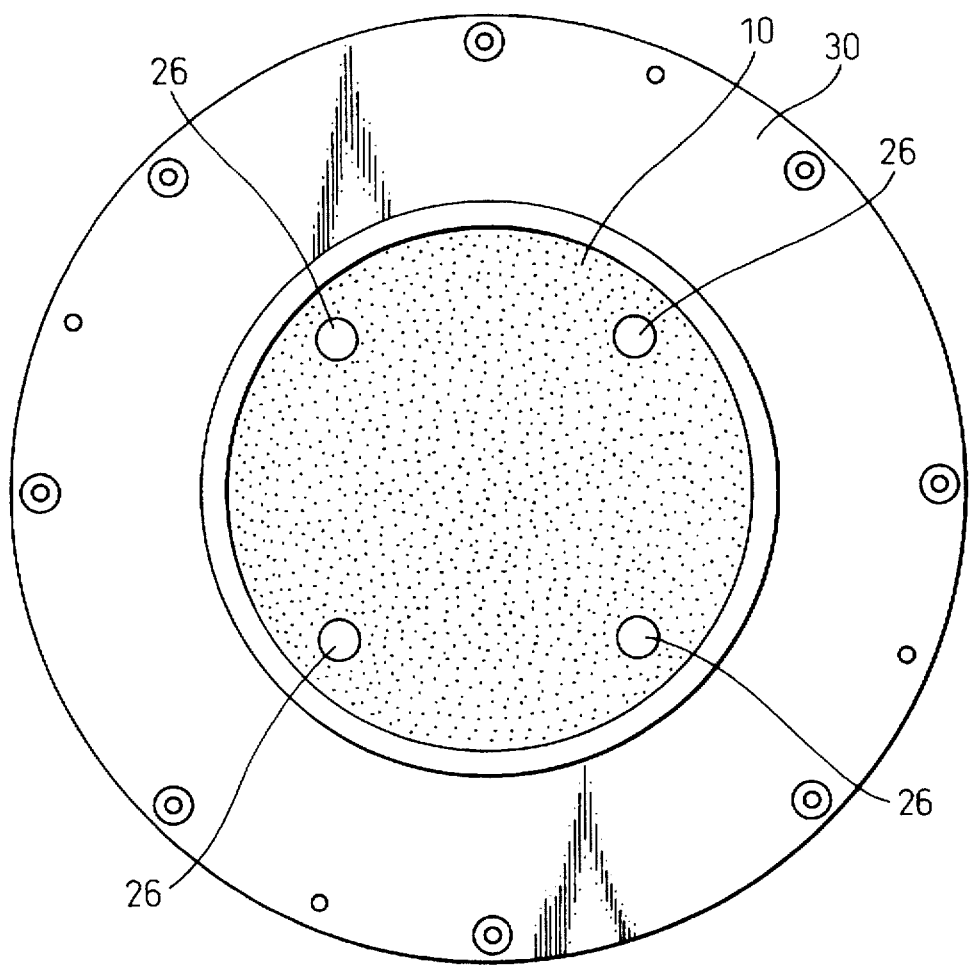
FIG. 5 is a plan view of the electrostatic chuck of FIG. 1 mounted on a support plate.
Figure 6:
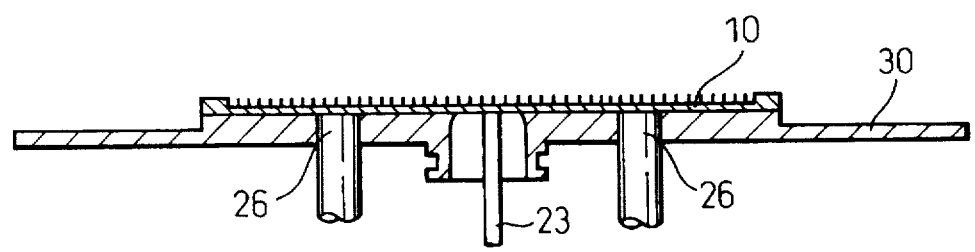
FIG. 6 is a cross-sectional view of the electrostatic chuck of FIG. 5.

In FIGS. 5 and 6, the electrostatic chuck 10 has a small thickness as a whole and is used in close contact on an aluminum support plate 30 having excellent heat conductivity.

The aluminum support plate 30 supporting the electrostatic chuck 10 is disposed in a vacuum chamber in which semiconductors such as silicon wafers will be subjected to the etching or CVD. The wafer W is held by the electrostatic chuck 10 and is subjected to a desired treatment in the vacuum chamber.

When a voltage is applied across the electrode 14 and the wafer W to hold the wafer W on the electrostatic chuck 10, the wafer W is attracted by the electrostatic chuck 10 due to the coulomb force. The coulomb force is found from $F_Q = A (V/d)^2$, where A is a constant, V is a voltage, and d is a thickness of the first layer 16 of the dielectric member 12. The wafer W comes into a substantial point-contact with the dielectric member 12 at the tips of the fine projections 28.

A helium gas is introduced as the cooling gas into the cooling gas-feeding ports 26. Therefore, the wafer W is cooled by the cooling gas and is maintained at a nearly constant temperature determined by the pressure of the cooling gas and the voltage across the wafer W and the dielectric member 12. In the present invention, the wafer W is substantially in point-contact with the dielectric member 12 at the tips of the fine projections 28. Accordingly, the conduction of heat is very small between the wafer W and the dielectric member 12, and the cooling gas only comes into substantial contact with the wafer W except the surface of the wafer W on the side being treated. Therefore, even if there exists a temperature distribution in the dielectric member 12, the wafer W is uniformly cooled by the cooling gas without being affected by the temperature distribution in the dielectric member 12; i.e., the temperature distribution becomes uniform in the wafer W.

Figure 10:
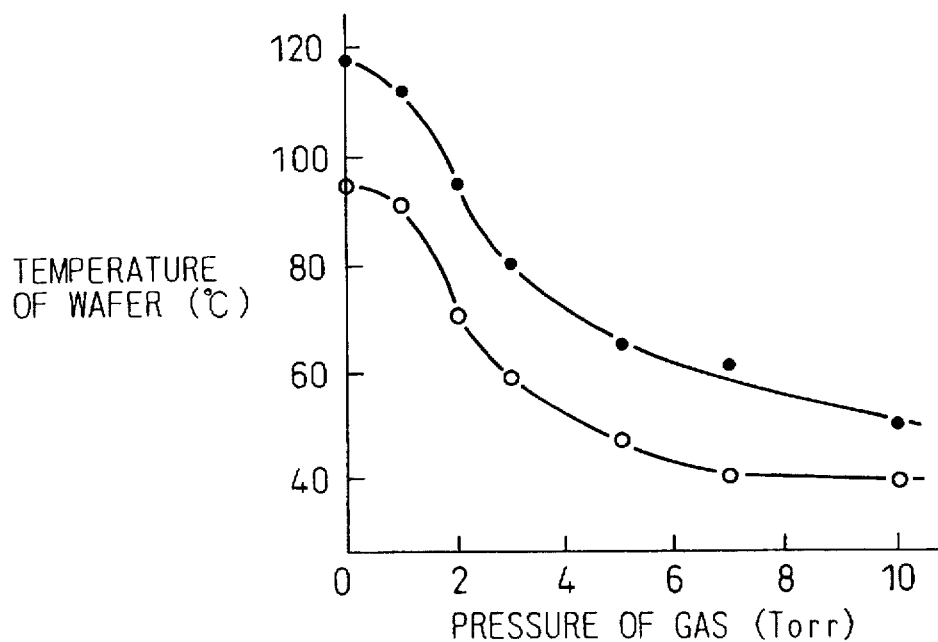
FIG. 10 is a graph illustrating the relationship between the gas pressure and the wafer temperature.

FIG. 10 illustrates the relationship between the pressure of the cooling gas and the temperature of the wafer W, wherein black dots represent the pressures of the cooling gas necessary for maintaining the wafer W at 30° C. when an electric power of 600 watts is supplied, and white dots represent the pressures of the cooling gas necessary for maintaining the wafer W at 30° C. when the electric power of 400 watts is supplied. It will be understood that the pressure of the cooling gas may be from 5 to 20 Torr. The pressure of 5 to 20 Torr corresponds to a low or medium vacuum range compared with the atmospheric pressure. However, a higher degree of vacuum has been established in the vacuum chamber for producing semiconductors. That is, the pressure (of the cooling gas) in space formed between the surface 16a of the electrostatic chuck 10 and the wafer W is higher than the pressure in the vacuum chamber. Therefore, the attracting force of the electrostatic chuck 10 must be larger than the pressure of the cooling gas that works to push the wafer W away from the electrostatic chuck 10, and a larger attracting force is required as the pressure of the cooling gas increases.

Figure 11:
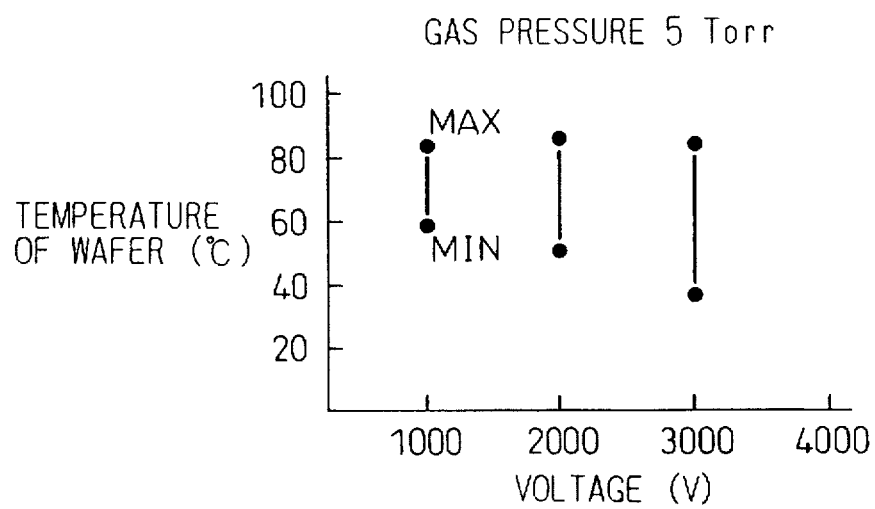
FIG. 11 is a diagram illustrating the relationship between the voltage and the wafer temperature when the gas pressure is 5 Torr.
Figure 12:
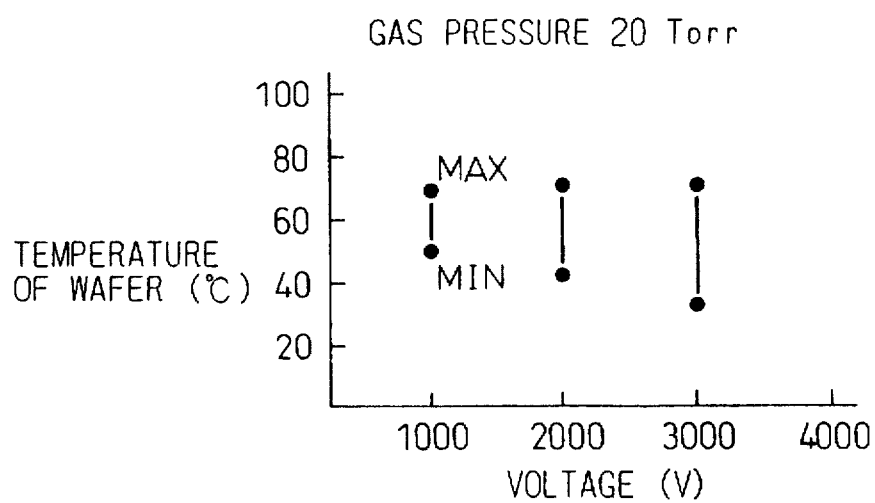
FIG. 12 is a diagram illustrating the relationship between the voltage and the wafer temperature of when the gas pressure is 20 Torr.

FIGS. 11 and 12 are diagrams illustrating the measurement of the temperature of the wafer W by using a conventional electrostatic chuck having a circular groove instead of the fine projections 28. The production conditions were as described below. That is, the wafer having a diameter of 8 inch and a thickness of 1 mm was treated in a vacuum chamber of 2000 mTorr with RF2000W for 2 minutes. In FIG. 11, the electrostatic chuck possessed two concentric grooves, and the pressure of the cooling gas was 5 Torr. Tn FIG. 12, the electrostatic chuck possessed five concentric grooves, and the pressure of the cooling gas was 20 Torr.

It will be understood from FIGS. 11 and 12, that the upper limit of temperature of the wafer varies depending upon the pressure of the cooling gas, but the rate of change is so small that there is no need to elevate the pressure of the cooling gas excessively. The lower limit of temperature of the wafer greatly varies depending upon the chuck voltage, and the width between the upper limit and the lower limit increases with an increase in the chuck voltage. It is therefore not recommended to increase the chuck voltage. In other words, it is recommended to produce an attracting force to such a degree that the cooling gas does not leak without so increasing the pressure of the cooling gas and without so increasing the chuck voltage, either. In this sense, the present invention in which the wafer W is brought into a point contact with the surface 16a of the first layer 16 of the dielectric 12 utilizing the fine projections 28, may not be suited for applying a high chuck voltage to obtain a very large attracting force, but makes it possible to reliably hold the wafer W and to maintain the wafer W at a constant temperature.

When a voltage is applied across the electrode 14 and the wafer W, the electric charge concentrates at the fine projections 28 making it possible to produce a stronger attracting force. Therefore, the wafer W is reliably attracted by the dielectric member 12. Besides, since the fine projections 28 are arranged in a predetermined configuration and at a constant pitch, the wafer W is uniformly cooled by the cooling gas.

It is further desired that the fine projections 28 have a height which is smaller than a mean free path of the cooling gas. In this case, molecules of the cooling gas do not collide against each other within the height of the fine projections 28, i.e., within the gap between the wafer W and the surface 16a of the first layer 16 of the dielectric member 12. Accordingly, no heat is generated by the collision, and a high cooling efficiently is maintained.

It is desired that the height of the fine projections lies within a range which is not larger than the mean free path of the cooling gas, in particular, the height is not larger than 30 μm. When, for example, helium is used as the cooling gas, the mean free path of helium is 147.2 μm at a temperature of 25° C. under a pressure of 1 Torr. When the wafers W are to be cooled using the electrostatic chuck 10, helium is, in many cases, used at a pressure of from 5 to 20 Torr and, in this case, the mean free path is from 15 to 30 μm. It is, therefore, desired that the fine projections 28 have a height of from 15 to 30 μm.

In addition, to enhance the heat-exchanging efficiency between the cooling gas and the electrostatic chuck 10, the coarseness Ra of the surface 16a of the dielectric 12 including the fine projections 28 should be set to lie in the range of from 1 to 2 μm. This enables the accommodation coefficient of the cooling gas to become not smaller than 0.1.

Figure 9:
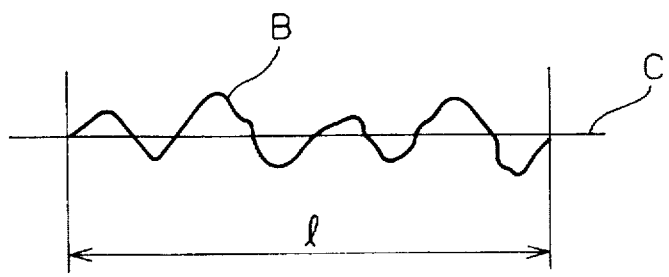
FIG. 9 is a diagram illustrating the surface coarseness.

FIG. 9 is a view illustrating how the coarseness Ra of the surface 16a of the dielectric 12 which includes the fine projections 28 is calculated. The surface coarseness Ra is also referred to as a center line average coarseness and is found as described below. First, the coarseness of the surface 16a is measured using a microgauge to form a coarseness curve B. Then, absolute values of the plus portions and the minus portions of the coarseness curve B relative to the center line C are calculated, and are integrated along the length l of measurement. The integrated value is divided by the length l of measurement to obtain the surface coarseness Ra.

An accommodation coefficient represents the degree of transfer of heat energy when the molecules of a gas impinge upon the walls. When a temperature of the incident molecule is denoted by Ti, a temperature of the reflected molecule by Tr and a temperature of the wall by Tw, then, an accommodation coefficient is given by $\alpha=(Tr-Ti)/(Tw-Ti)$. When the accommodation coefficient $\alpha$ is 1, there is a perfect energy conversion and when the accommodation coefficient $\alpha$ is 0, there is no energy conversion. On an ordinary flat surface, $\alpha$ is about 0.01. When the surface coarseness Ra is from 1 to 2 μm, the accommodation coefficient a becomes larger than 0.1, so that heat can be favorably exchanged. It is therefore allowed to favorably cool the electrostatic chuck 10 by the cooling gas.

When a high voltage is to be applied across the wafer W and the electrode 14, the first layer 16 of the dielectric member 12 must have such a thickness as to exhibit high withstand voltage characteristics. When a high voltage of several thousand volts is applied, the thickness d of the first layer 16 of the dielectric member 12 calculated from the coulomb force ($F_Q=A(V/d)^2$) is as relatively small as from 0.2 to 0.3 mm, which may often not be satisfactory for obtaining the required withstand voltage characteristics.

When a high voltage is to be applied, it is desired that the thickness d of the first layer 16 of the dielectric member 12 is not smaller than 0.5 mm to obtain satisfactory withstand voltage characteristics. It is therefore desired that the attracting force for attracting the wafer W by the electrostatic chuck 10 is obtained by utilizing not only the coulomb force ($F_Q$) but also the Johnsen-Rahbek force.

Figure 13:
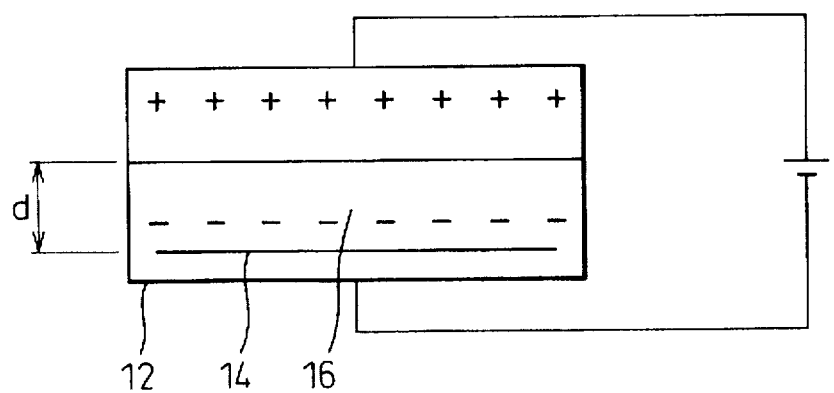
FIG. 13 is a diagrammatic view illustrating the attracting force based upon the coulomb force.

FIG. 13 illustrates the attracting force (F) which is obtained relying only upon the coulomb force ($F_Q$) to attract the wafer W by the electrostatic chuck 10.

Figure 14:
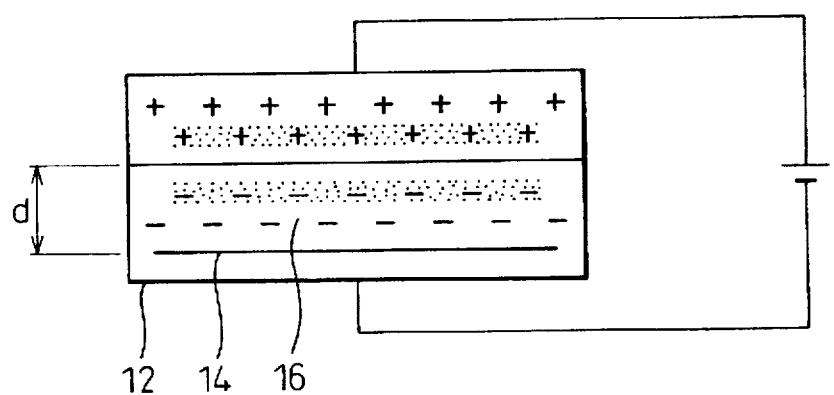
FIG. 14 is a diagrammatic view illustrating the attracting force based upon the coulomb force and the Johnsen-Rahbek force.

FIG. 14 illustrates the attracting force (F) which is obtained relying upon the coulomb force ($F_Q$) and the Johnsen-Rahbek force to attract the wafer W by the electrostatic chuck 10. The Johnsen-Rahbek effect is that the semiconductor is intimately adhered to a wall when a voltage is applied between the wall and the semiconductor. Though the mechanism of the Johnsen-Rahbek effect has not been clarified in detail yet, it was found that the Johnsen-Rahbek effect is obtained by the electrostatic chuck 10 by employing the dielectric member 12 of the type which has a small resistance than those that are usually used and by causing a very small current to flow between the electrode 14 and the wafer W.

Figure 15:
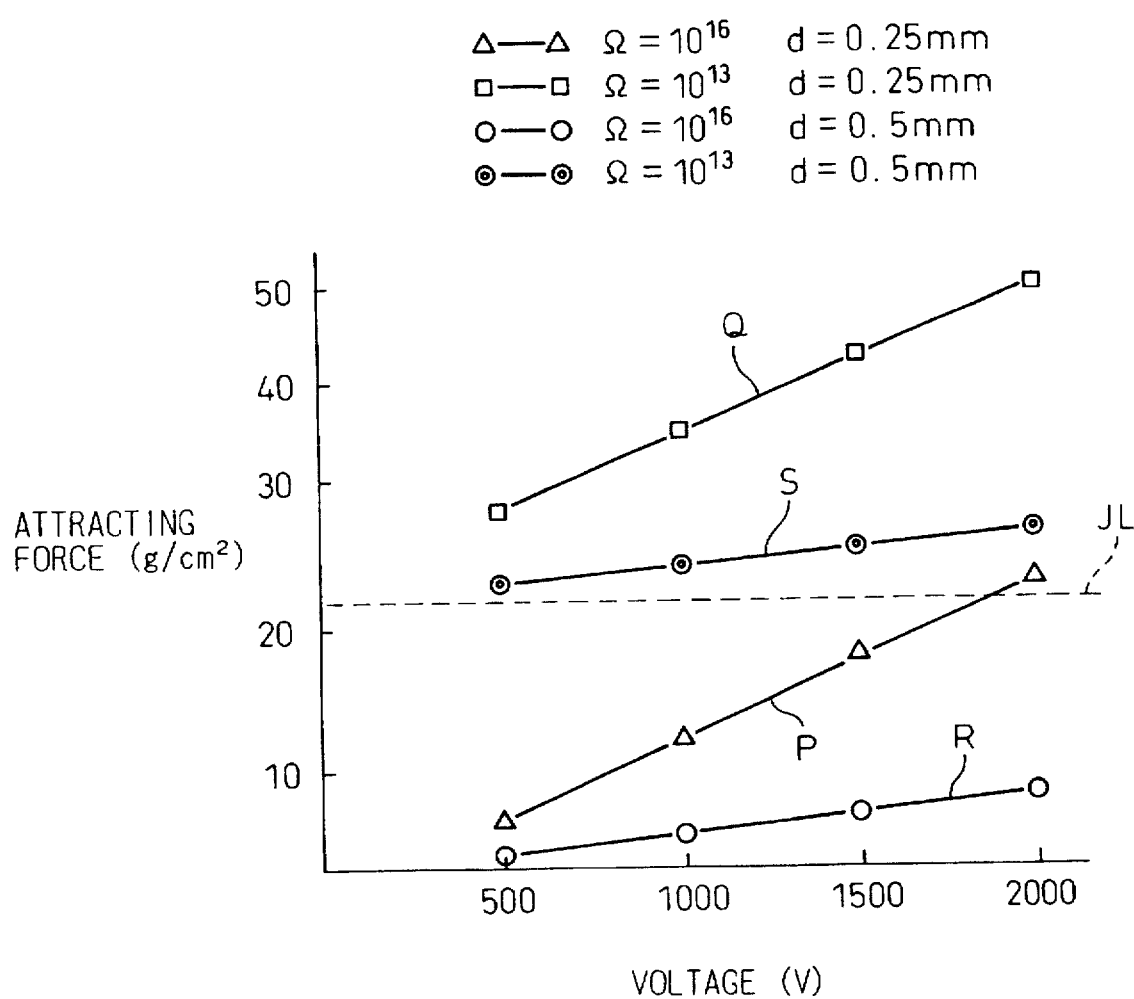
FIG. 15 is a graph illustrating the relationship between the voltage and the attracting force.

FIG. 15 is a diagram illustrating the attracting forces (F) under various conditions. A curve P drawn by plotting triangular dots represents a case where the electrostatic chuck 10 is formed of the dielectric member 12 of the high resistance type ($10^{16}$ Ω·cm) and the first layer 16 of the dielectric member 12 has a thickness d of 0.25 mm. A curve Q drawn by plotting square dots represents a case where the electrostatic chuck 10 is formed of the dielectric member 12 of the low resistance type ($10^{13}$ Ω·cm) and the first layer 16 of the dielectric member 12 has a thickness d of 0.25 mm.

Similarly, a curve R drawn by plotting round dots represents a case where the electrostatic chuck 10 is formed of the dielectric member 12 of the high resistance type ($10^{16}$ Ω·cm) and the first layer 16 of the dielectric member 12 has a thickness d of 0.5 mm, and a curve S drawn by plotting double circular dots represents a case where the electrostatic chuck 10 is formed of the dielectric member 12 of the low resistance type ($10^{13}$ Ω·cm) and the first layer 16 of the dielectric member 12 has a thickness d of 0.5 mm.

In the case of the curve P, the attracting force (F) increases with an increase in the voltage, but the first layer 16 of the dielectric member 12 has the thickness d which is as thin as 0.25 mm. In the case of the curve Q of the low resistance type having the thickness d of as thin as 0.25 mm, a large attracting force (F) is obtained. In the case of the curve R, the attracting force (F) does not so increase even though the voltage is increased. In the case of the curve S of the low resistance type having the thickness d of 0.5 mm, a very large attracting force (F) is obtained.

A curve JL representing a difference between the curve P and the curve Q, or representing a difference between the curve R and the curve S, corresponds to the Johnsen-Rahbek force ($F_J$). The Johnsen-Rahbek force ($F_J$) is not smaller than 20 g/cm². The value 20 g/cm² is equivalent to 6280 g/cm² in the case of an 8-inch wafer W, which can withstand the pressure of the cooling gas of up to about 14 Torr. Therefore, even when the coulomb force ($F_Q$) becomes very small due to the thickness d of the dielectric member 12 which is not smaller than 0.5 mm, the Johnsen-Rahbek force ($F_J$) alone is capable of substantially attracting and holding the wafer W. Though the above description has dealt with an example in which the dielectric member 12 of the low resistance type possessed a resistivity of $10^{13}$ Ω·cm, it is also allowable to select the resistivity of the low resistance type from a range of $10^{10}$ to $10^{13}$ and to select the thickness of the first layer 16 of the dielectric member 12 to be not smaller than 0.5 mm, in order to obtain a sufficiently large withstand voltage characteristics against the applied voltage.

Figure 16:
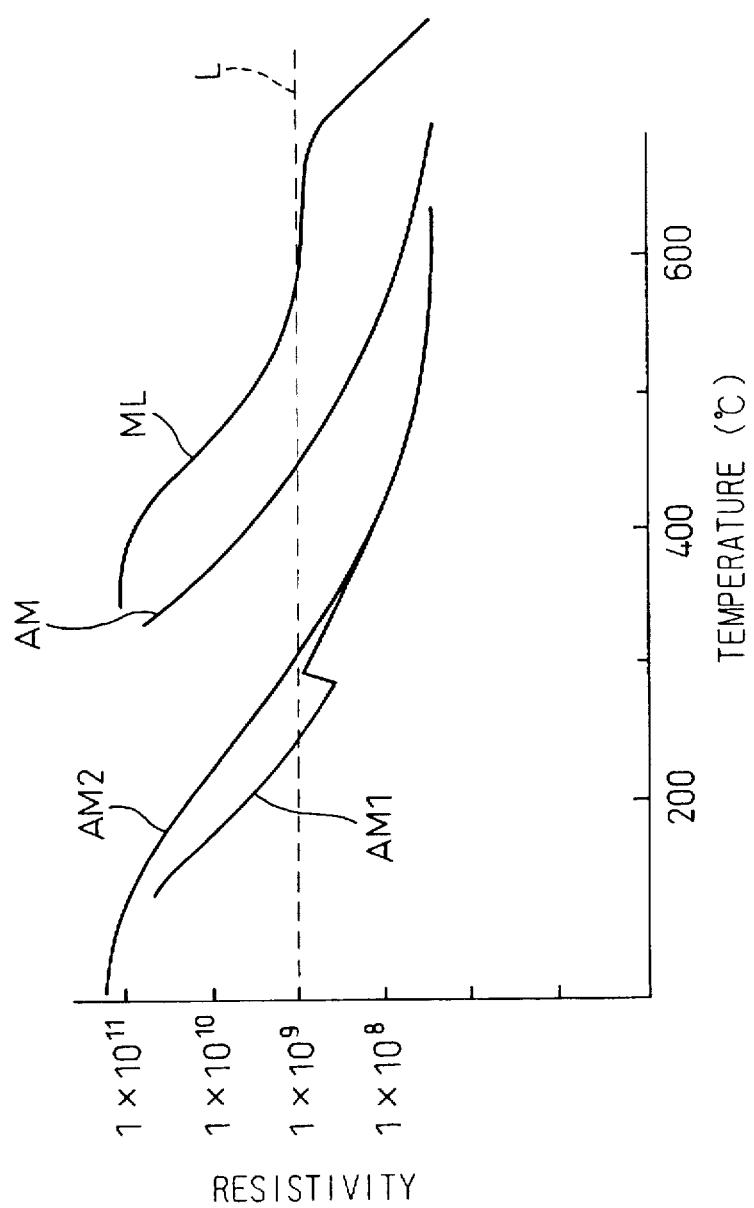
FIG. 16 is a graph illustrating the relationship between the temperature and the resistivity of dielectrics member.

FIG. 16 is a diagram illustrating changes in the resistivity of various kinds of ceramics used as the dielectric member 12 relative to a change in the temperature. AM1 represents the resistivity of an alumina of the medium low class, AM2 represents the resistivity of an alumina of the medium class, AM3 represents the resistivity of an alumina of the high class, and ML represents the resistivity of the mullite. The alumina of the high class contains about 8% of silicon dioxide ($SiO_2$) and the mullite contains about 40% of silicon dioxide ($SiO_2$). A broken line L represents an allowable lower limit of resistivity.

The electrostatic chuck 10 is often used at a high temperature (e.g., 500° C.) in the plasma atmosphere, and the resistivity of the dielectric member 12 decreases with an increase in the temperature of the dielectric member 12. When the electrostatic chuck 10 is used at, for example, 500° C., the mullite only exhibits the resistivity higher than the lower limit L at that temperature. When the electrostatic chuck 10 is used at a high temperature, as described above, it is recommended to form the dielectric member 12 using a ceramic containing not less than 30% of silicon dioxide ($SiO_2$), so that a resistivity larger than the lower limit L is obtained at that temperature. Examples of the ceramic that is adapted to this include glass ceramic in addition to alumina and mullite.

Figure 17:
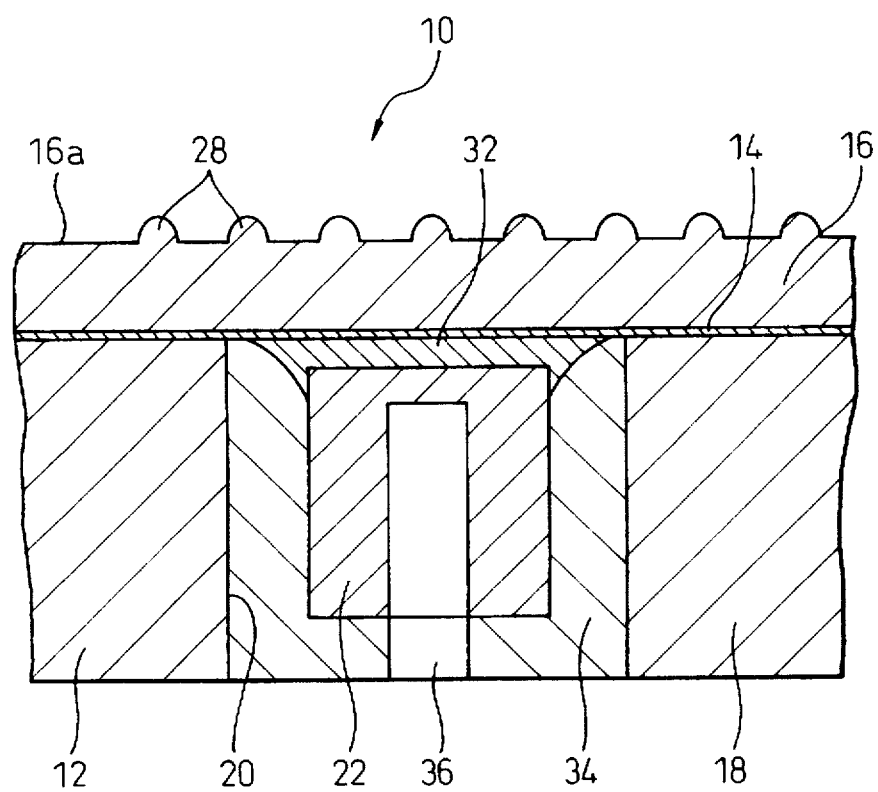
FIG. 17 is a cross-sectional view of a portion of the dielectric member for mounting a metal terminal.

FIG. 17 is a view illustrating, on an enlarged scale, a portion of the dielectric member 12 for mounting the metal terminal 22. As described earlier, the second layer 18 of the dielectric member 12 is provided with a hole 20, and the metal terminal 22 is disposed in the hole 20. The metal terminal 22 is composed of, for example, KOVAR™ material and is brazed to the electrode 14 via a silver/copper layer 32. In this constitution, a gap is formed between the metal terminal 22 and the wall 20 of the hole 20. In this embodiment, a layer 34 of a solder (Pb+Sn) alloy is inserted. The layer 34 of the solder alloy is inserted in a molten state in the gap without forming voids, and is then hardened. In filling the solder alloy, a pin or the like is inserted so that the metal terminal 22 is exposed. After being hardened, the pin is pulled out to form a hole 36.

Therefore, the gap of the dielectric member 12 is filled, and the dielectric member 12 is prevented from losing its heat conductivity. Besides, the solder alloy is softer than the ceramic or the KOVAR™, and absorbs the thermal expansion or the thermal contraction of the dielectric member 12 caused by a change in the temperature during the use. Though the above embodiment has dealt with the case of using the solder alloy, it is also allowable to fill the gap of the dielectric member 12 with any other soft metal such as aluminum or indium that can be inserted in a molten state in the gap and can be hardened, in addition to using the solder alloy.

Moreover, the gap of the dielectric member 12 can be filled not only with the soft metal but also with a highly heat-conducting resin. In this case, metal particles such as of silver having a high heat conductivity are mixed into a resin which is used in the form of a paste.

As described above, according to the present invention, there is obtained an electrostatic chuck which is capable of reliably holding the wafer maintaining a stable temperature. It is further made possible to obtain an electrostatic chuck which sufficiently holds the wafer against the pressure of the cooling gas, exhibits withstand voltage characteristics to a sufficient degree, and can be used even at high temperatures, without causing the heat conductivity to be deteriorated at the terminal of the electrode.

We claim:

1. An electrostatic chuck comprising:

an electrode having first and second surfaces;
a dielectric member having a first layer for covering at least the first surface of said electrode, said dielectric member being of a low resistance type, having a resistivity in a range from $10^{10}$ to $10^{13}$ Ωcm, and the first layer having a thickness greater than 0.5 mm;
power supply means for conducting electric power to said electrode; and
cooling gas-feeding means for feeding a cooling gas onto the surface of said first layer of said dielectric member,
wherein a plurality of fine projections are formed on the surface of said first layer of said dielectric member, each of said fine projections being shaped to have a tip and a root, the tip being smaller than the root to hold a wafer in substantially a point-contact manner, and the wafer held on the surface of the first layer of said dielectric member is cooled by the cooling gas fed from said cooling gas-feeding means.

2. An electrostatic chuck according to claim 1, wherein said fine projections are each formed in the shape of a dome.

3. An electrostatic chuck according to claim 1, wherein said fine projections are each formed in the shape of a pyramid.

4. An electrostatic chuck according to claim 1, wherein said fine projections are arranged in a predetermined configuration and at a predetermined pitch.

5. An electrostatic chuck according to claim 4, wherein said fine projections are arranged at a pitch smaller than 4 mm.

6. An electrostatic chuck according to claim 1, wherein said fine projections each have a height smaller than a mean free path of the cooling gas.

7. An electrostatic chuck according to claim 6, wherein the height of each said fine projection is smaller than 30 μm.

8. An electrostatic chuck according to claim 1, wherein the surface of said dielectric member including said fine projections has a coarseness (Ra) in the range of from 1 to 2 μm.

9. An electrostatic chuck according to claim 1, wherein said dielectric member comprises a ceramic containing not less than 30% of silicon dioxide ($SiO_2$).

10. An electrostatic chuck according to claim 1, wherein said dielectric member has a second layer for covering the second surface of said electrode, and said means for conducting electric power to said electrode comprises a metal terminal disposed in a hole formed in the second layer of said dielectric and is connected to said electrode, and a soft metal inserted in a molten state between said metal terminal and the wall of the hole formed in said second layer and hardened.

11. An electrostatic chuck according to claim 1, wherein said dielectric member has a second layer for covering the second surface of said electrode, and said means for conducting electric power to said electrode comprises a metal terminal disposed in a hole formed in the second layer of said dielectric and is connected to said electrode, and a highly heat-conducting resin inserted between said metal terminal and the wall of the hole formed in said second layer.

12. An electrostatic chuck comprising an electrode having first and second surfaces, a dielectric member having first and second layers for covering the first and second surfaces of said electrode, means for conducting electric power to said electrode, and cooling gas-feeding means for feeding a cooling gas onto the surface of said first layer of said dielectric member, wherein said means for conducting electric power to said electrode comprises a metal terminal disposed in a hole formed in the second layer of said dielectric and is connected to said electrode, and a soft metal inserted in a molten state between said metal terminal and the wall of the hole formed in said second layer, and is hardened.

13. An electrostatic chuck as recited in claim 12, wherein said metal terminal has a first end thereof attached to the electrode and a second end thereof having a hole therein.

14. An electrostatic chuck as recited in claim 12, wherein the soft metal is substantially flush with a bottom surface of the second layer, with an end of the metal terminal being embedded in the soft metal.

15. An electrostatic chuck comprising an electrode having first and second surfaces, a dielectric member having first and second layers for covering the first and second surfaces of said electrode, means for conducting electric power to said electrode, and cooling gas-feeding means for feeding a cooling gas onto the surface of said first layer of said dielectric member, wherein said means for conducting electric power to said electrode comprises a metal terminal disposed in a hole formed in the second layer of said dielectric member and is connected to said electrode, and a highly heat-conducting resin inserted between said metal terminal and the wall of the hole formed in said second layer, said heat-conducting resin including metal particles.

* * * * *